United States Patent
Chen et al.

(10) Patent No.: US 9,930,805 B2
(45) Date of Patent: Mar. 27, 2018

(54) BRACKET AND FOOLPROOF DEVICE THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chun-Yi Ho, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 15/256,630

(22) Filed: Sep. 5, 2016

(65) Prior Publication Data
US 2017/0181543 A1   Jun. 29, 2017

(30) Foreign Application Priority Data
Dec. 26, 2015   (TW) .............................. 104143929 A (51) Int. Cl.
| | |
|---|---|
| A47B 88/423 | (2017.01) |
| H05K 7/14 | (2006.01) |
| A47B 96/06 | (2006.01) |
| A47B 88/43 | (2017.01) |

(52) U.S. Cl.
CPC ......... *H05K 7/1489* (2013.01); *A47B 96/068* (2013.01); *A47B 88/423* (2017.01); *A47B 88/43* (2017.01)

(58) Field of Classification Search
USPC ............ 248/221.11, 222.11, 220.21, 220.22; 108/143, 137, 102; 312/330.1, 334.1, 312/334.5, 334.8
See application file for complete search history.

(56) References Cited

U.S. PATENT DOCUMENTS

| | | | | |
|---|---|---|---|---|
| 7,281,694 | B2 * | 10/2007 | Allen ................... | A47B 96/068 211/183 |
| 7,552,899 | B2 | 6/2009 | Chen | |
| 7,694,926 | B2 | 4/2010 | Allen | |
| 7,699,279 | B2 * | 4/2010 | Chen ..................... | A47B 88/43 248/220.22 |
| 7,878,468 | B2 | 2/2011 | Chen | |
| 8,371,454 | B2 | 2/2013 | Chen | |
| 9,125,489 | B2 * | 9/2015 | Chen .................... | A47B 88/044 |
| 2008/0078899 | A1 * | 4/2008 | Chen ..................... | A47B 88/43 248/220.21 |

* cited by examiner

*Primary Examiner* — Alfred J Wujciak
(74) *Attorney, Agent, or Firm* — Winston Hsu (57) ABSTRACT

A bracket is configured to be mounted to a post of a rack. The bracket includes a side plate, an end plate, a first mounting member and a foolproof device. The end plate is substantially perpendicularly connected to the side plate. The first mounting member is mounted to the end plate. The foolproof device is arranged at a side of the end plate. When the bracket is placed at a first mounting angle relative to the post, the fool proof device does not interfere with the bracket, in order to allow the bracket to be mounted to the post. When the bracket is placed at a second mounting angle relative to the post, the foolproof device interferes with the bracket, in order to prevent the bracket from being mounted to the post.

10 Claims, 10 Drawing Sheets

BRACKET AND FOOLPROOF DEVICE THEREOF

BACKGROUND OF THE INVENTION

1. Field of the Invention

The present invention relates to a bracket, and more particularly, to a bracket with a foolproof function.

2. Description of the Prior Art

U.S. Pat. No. 7,694,926 B2 of Allen et al. discloses a rack comprising a plurality of posts arranged symmetrically. A chassis is mounted to left posts or right posts of the rack respectively by a pair of slide rail assemblies, in order to mount the chassis to the rack.

Therefore, the slide rail assembly has to be correctly mounted on a left side or a right side of the rack when mounting the chassis to the rack. Currently, a manufacturer of the slide rail assembly may mark "R" or "L" on a rail of the slide rail assembly for indicating that the slide rail assembly is configured to be mounted to the left side or the right side of the rack. However, the slide rail assembly may be mounted to a wrong side on the rack due to carelessness of a user, so as to cause installation errors. The installation errors may endanger safety of the user and equipment. The present invention is provided to solve such problem.

SUMMARY OF THE INVENTION

The present invention relates to a bracket and a foolproof device, capable of preventing a bracket of a slide rail assembly from being mounted to a wrong side on a rack.

According to an embodiment of the present invention, A bracket is configured to be mounted to a rack, and the bracket comprises a side plate, an end plate substantially perpendicular connected to the side plate, a first mounting member mounted to the end plate, and a foolproof device arranged at a side of the end plate. Wherein, when the bracket is placed at a first mounting angle relative to the rack, the foolproof device does not interfere with the rack, in order to allow the first mounting member to be mounted to the rack; when the bracket is placed at a second mounting angle relative to the rack, the foolproof device interferes with the rack, in order to prevent the first mounting member from being mounted to the rack.

Preferably, the bracket further comprises a mounting base mounted to the end plate, and connected to the first mounting member.

Preferably, the end plate of the bracket has a through hole, the foolproof device comprises a sliding block and a positioning member. A first room is formed in a first part of the mounting base for accommodating the sliding block, and a second room is formed in a second part of the mounting base for accommodating the positioning member. When the bracket is placed at the first mounting angle relative to the rack, the sliding block is movable relative to the first room of the mounting base. When the bracket is placed at the second mounting angle relative to the rack, the positioning member is moved to insert into an engagement feature of the sliding block in order to prevent the sliding block from moving relative to the first room of the mounting base, such that the sliding block interferes with the rack.

Preferably, the foolproof device further comprises an elastic member arranged in the first room of the mounting base for providing an elastic force to the sliding block, such that the sliding block is configured to partially pass through the through hole of the end plate of the bracket in response to the elastic force of the elastic member.

Preferably, an angle difference between the first mounting angle and the second mounting angle is 180 degrees.

Preferably, the bracket further comprises a second mounting member mounted to the end plate of the bracket, and configured to be mounted to the rack.

According to another embodiment of the present invention, a bracket is configured to mount a rail to a post, the post having a plurality of mounting holes. The bracket comprises a side plate configured to be mounted to the rail, an end plate having a through hole, a first mounting member mounted to the endplate of the bracket, and a foolproof device comprising a sliding block, a positioning member and an elastic member. The sliding block corresponds to the through hole of the end plate, and the sliding block has an engagement feature. The positioning member corresponds to the engagement feature of the sliding block. The elastic member is configured to provide an elastic force to the sliding block such that the sliding block is configured to partially pass through the through hole of the end plate in response to the elastic force of the elastic member. Wherein, when the bracket is placed at a first mounting angle relative to the post, the sliding block is pressed by the post to retract for compressing the elastic member, in order to allow the first mounting member to insert into one of the plurality of mounting holes for mounting the rail to the post; when the bracket is placed at a second mounting angle relative to the post, the positioning member is moved to engage with the engagement feature of the sliding block, such that the sliding block protrudes through the through hole of the endplate to interfere with the post, in order to prevent the first mounting element from being inserted into one of the plurality of mounting holes of the post.

Preferably, the bracket further comprises a locking member operatively arranged at a locking position adjacent to the post.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
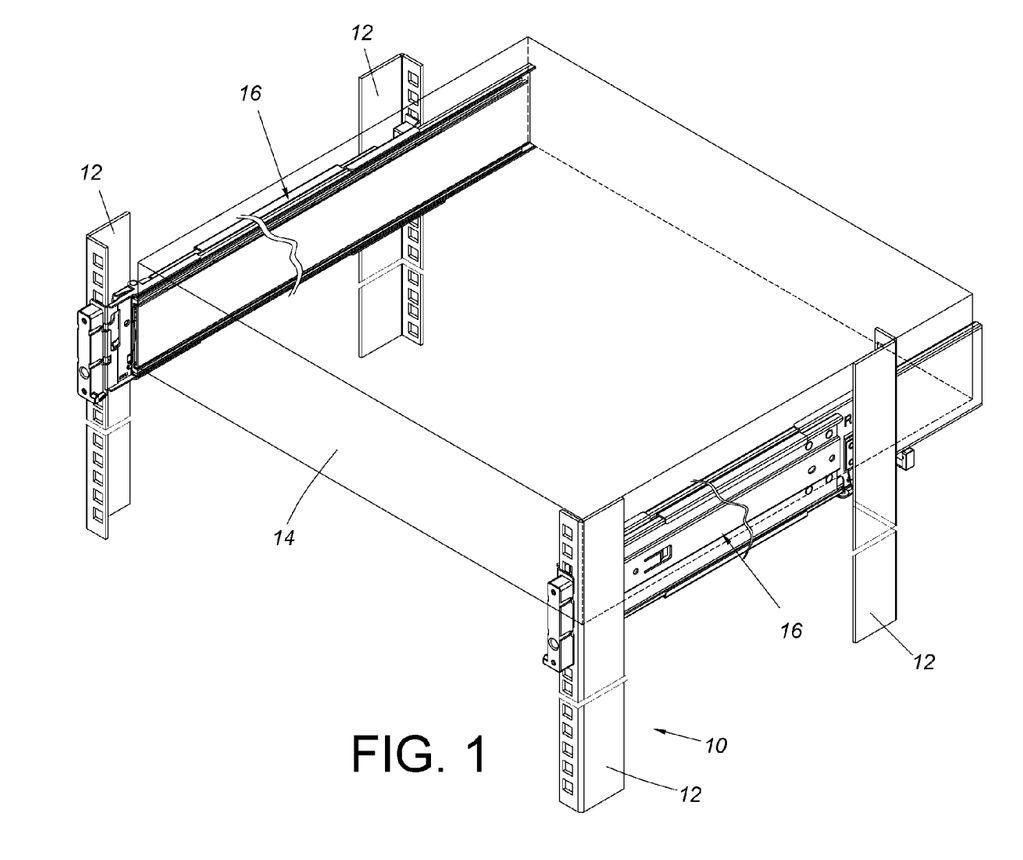
FIG. 1 is a diagram showing a chassis being mounted to a rack by a pair of slide rail assemblies according to an embodiment of the present invention.

As shown in FIG. 1, a rack 10 comprises a plurality of posts 12 arranged symmetrically, and a chassis 14 is mounted to left posts 12 and right posts of the rack 10 respectively by a pair of slide rail assemblies 16, in order to mount the chassis 14 to the rack 10.

Figure 2:
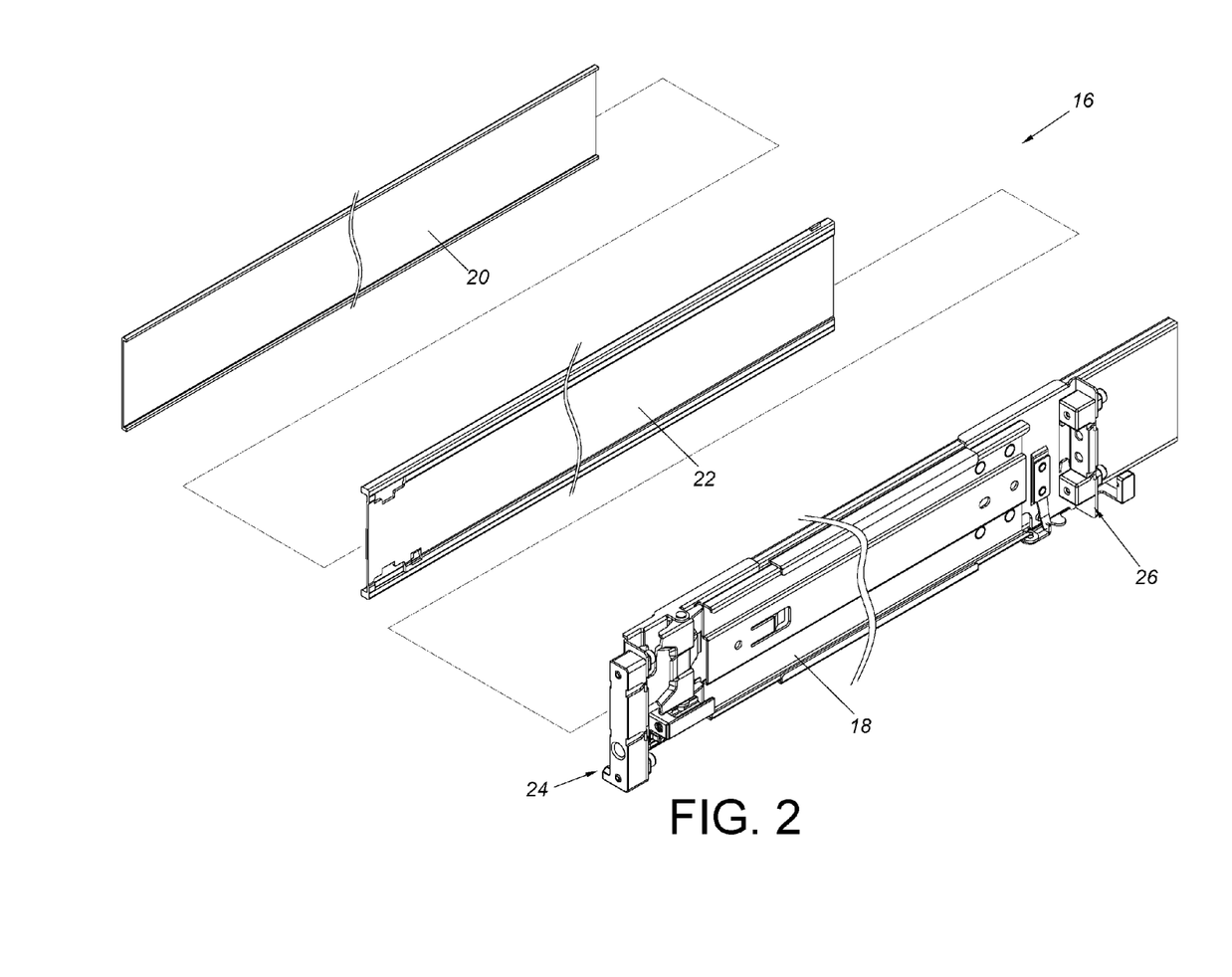
FIG. 2 is an exploded view of the slide rail assembly according to an embodiment of the present invention.

As shown in FIG. 2, the slide rail assembly 16 of the present invention comprises a first rail 18, a second rail 20 and a third rail 22 movably arranged between the first rail 18 and the second rail 20. The third rail 22 is configured to extend a travel distance of the second rail 20 relative to the first rail 18. Wherein, a first bracket 24 and a second bracket 26 are respectively mounted to two ends of the first rail 18. The first bracket 24 and the second bracket 26 are configured to mount the slide rail assembly 16 to the rack 10.

Figure 3:
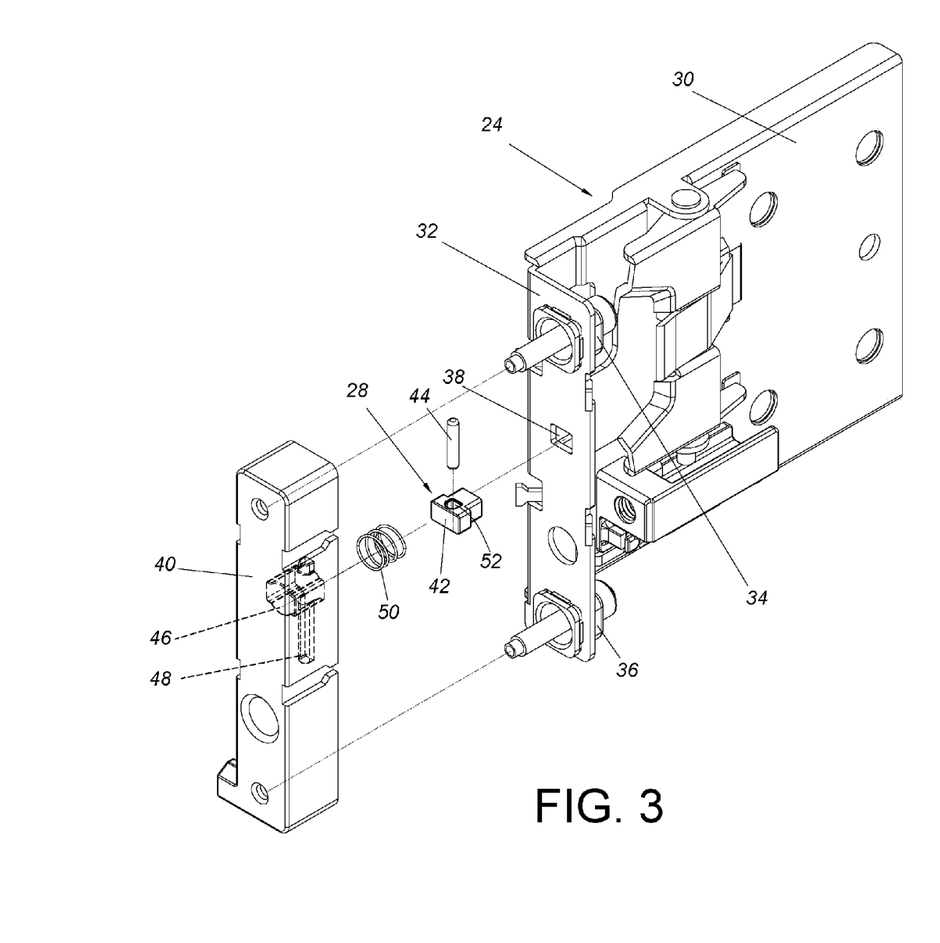
FIG. 3 is an exploded view of a first bracket arranged with a foolproof device according to an embodiment of the present invention.

As shown in FIG. 3, the first bracket 24 of the present invention is arranged with a foolproof device 28. The first bracket 24 comprises a side plate 30 configured to be mounted to the first rail 18, an endplate 32 substantially perpendicularly connected to the sideplate 30, and a first mounting member 34 and a second mounting member 36 respectively mounted to an upper part and a lower part of the end plate 32. Wherein, the end plate 32 is formed with a through hole 38. In a preferred embodiment, the first bracket 24 of the present invention further comprises a mounting base 40 mounted to the end plate 32 and connected to the first mounting member 34 and the second mounting member 36. The foolproof device 28 comprises a sliding block 42 and a positioning member 44. A first room 46 is formed in a first part of the mounting base 40 for accommodating the sliding block 42. A second room 48 is formed in a second part of the mounting base 40 for accommodating the positioning member 44. The sliding block 42 corresponds to the through hole 38 of the end plate 32 of the first bracket 24. In a preferred embodiment, the foolproof device 28 of the present invention further comprises an elastic member 50 arranged in the first room 46 of the mounting base 40 for providing an elastic force to the sliding block 42, such that the sliding block 42 is configured to partially pass through the through hole 38 of the end plate 32 in response to the elastic force of the elastic member 50. Moreover, the sliding block 42 further has an engagement feature 52, such as an opening. The positioning member 44 corresponds to the engagement feature 52 of the sliding block 42.

Figure 4:
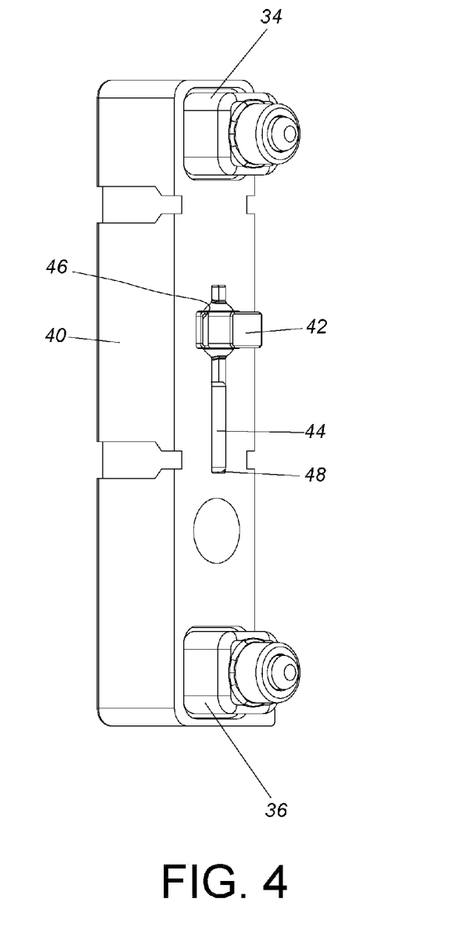
FIG. 4 is a diagram showing the foolproof device at a state when the mounting base is placed at a first mounting angle according to an embodiment of the present invention.

As shown in FIG. 4, the first mounting member 34 is located above the second mounting member 36. In such state, the positioning member 44 is located at a bottom of the second room 48 of the mounting base 40, such that the sliding block 42 is movable within the first room 46 of the mounting base 40.

Figure 5:
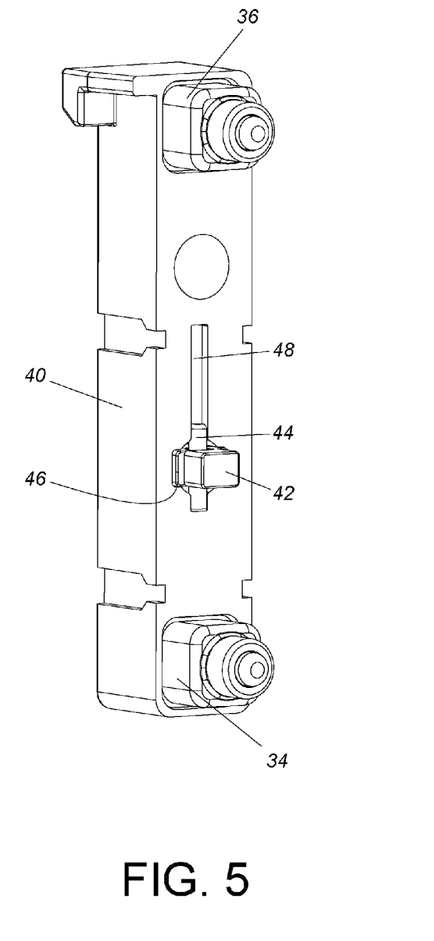
FIG. 5 is a diagram showing the foolproof device at a state when the mounting base is at a second mounting angle according to an embodiment of the present invention.

As shown in FIG. 5, when the mounting base 40 is rotated 180 degrees, the second mounting member 36 is located above the first mounting member 34. In such state, the positioning member 44 falls into the engagement feature 52 of the sliding block 42 due to gravity, such that the sliding block 42 is not movable within the first room 46 of the mounting base 40.

Figure 6:
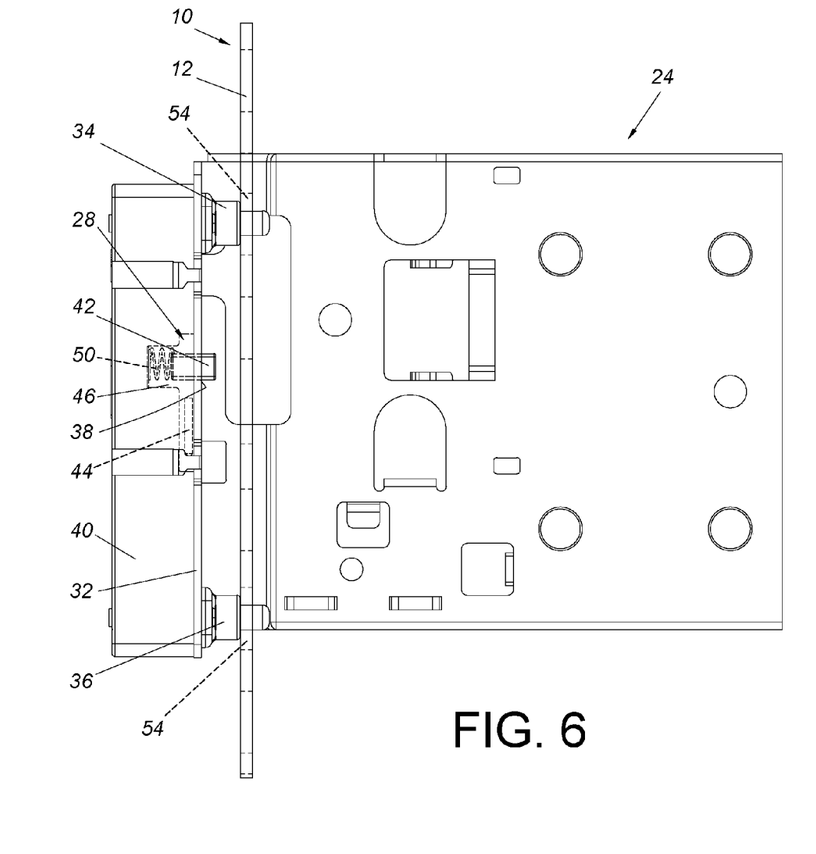
FIG. 6 is a diagram showing the first bracket being placed toward the post at the first mounting angle according to an embodiment of the present invention.
Figure 7:
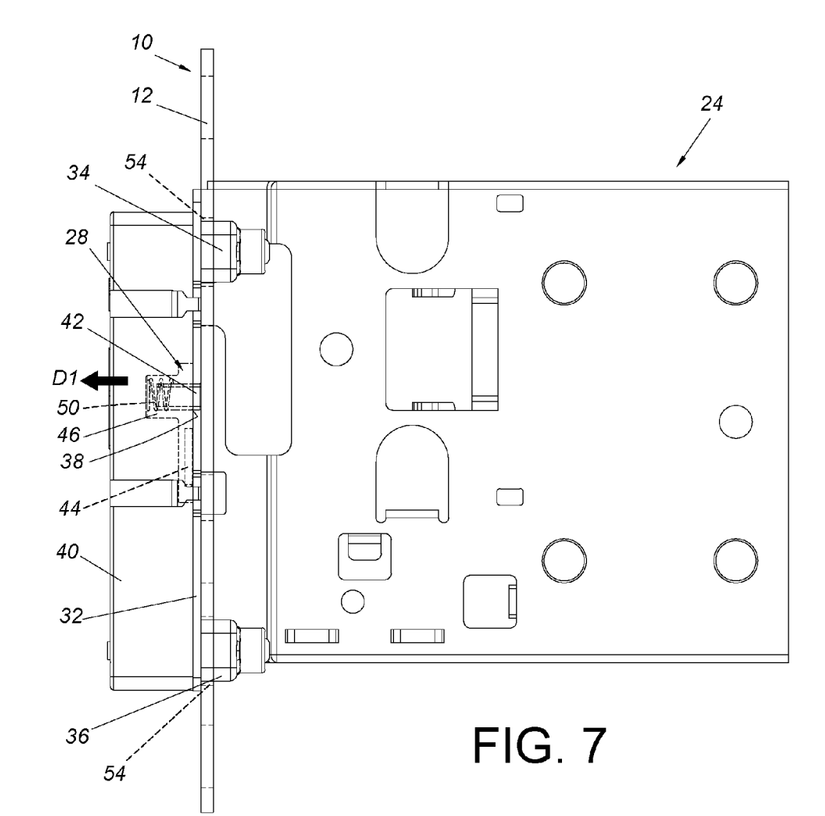
FIG. 7 is a diagram showing the first bracket being mounted to the post at the first mounting angle according to an embodiment of the present invention.

As shown in FIG. 6 and FIG. 7, one of the posts 12 of the rack 10 has a plurality of mounting holes 54. When the first bracket 24 is mounted to the post 12 at the first mounting angle, the first mounting member 34 is located above the second mounting member 36, and the sliding block 42 partially passes through the through hole 38 of the end plate 32 in response to the elastic force of the elastic member 50. Meanwhile, the foolproof device 28 does not interfere with the rack 12, in order to allow the first mounting member 34 and the second mounting member 36 of the first bracket 24 to be mounted to two of the mounting holes 54 of the post 12. In detail, when the first bracket 24 is in a correct installation state relative to the post 12, the positioning member 44 is located at the bottom of the second room 48 of the mounting base 40. Therefore, the sliding block 42 is movable within the first room 46 of the mounting base 40. As such, in the correct installation state, the sliding block 42 can be pressed by the post 12 to retract along a direction D1 for compressing the elastic member 50, in order to allow the first mounting member 34 and the second mounting member 36 of the first bracket 24 to be mounted to the post 12.

Figure 8:
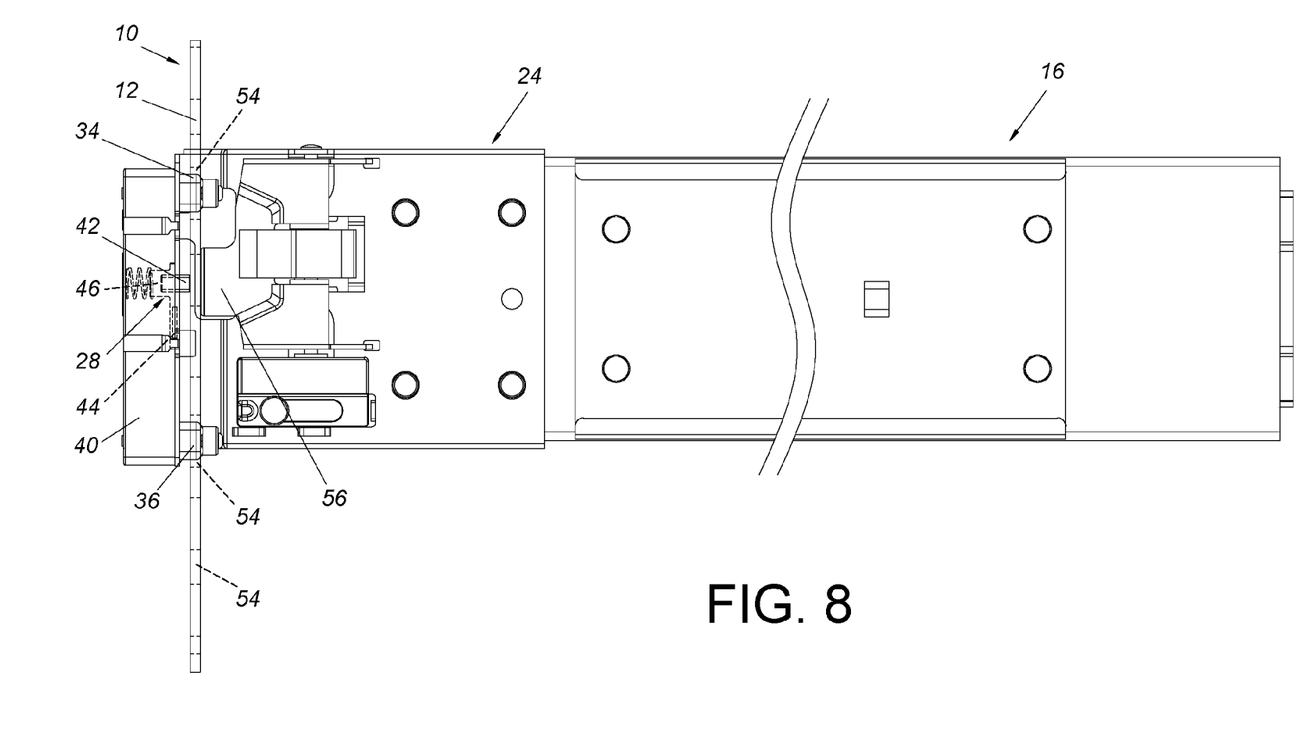
FIG. 8 is a diagram showing the first bracket comprising a locking member arranged at a locking position according to an embodiment of the present invention.
Figure 9:
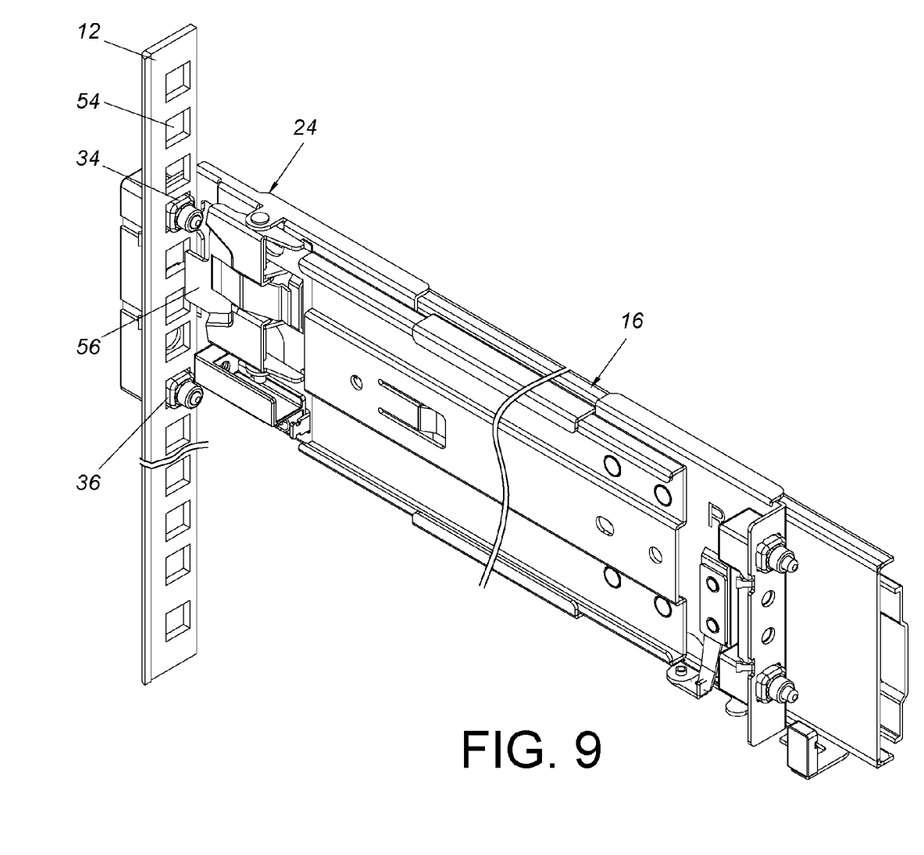
FIG. 9 is a diagram showing the slide rail assembly being mounted to the post according to an embodiment of the present invention.

As shown in FIG. 8 and FIG. 9, in a preferred embodiment, the first bracket 24 of the present invention further comprises a locking member 56. The locking member 56 is operatively arranged between a locking position and a unlocking position. Wherein, the locking member 56 shown in FIG. 8 and FIG. 9 is located at the locking position and adjacent to the post 12, in order to allow the first bracket 24 to be stably mounted to the post 12, so as to mount the slide rail assembly 16 to the post 12. When the locking member 56 is located at the unlocking position (not shown), the locking member 56 can be operatively moved away from the post 12, in order to dismount the slide rail assembly 16 from the post 12.

Figure 10:
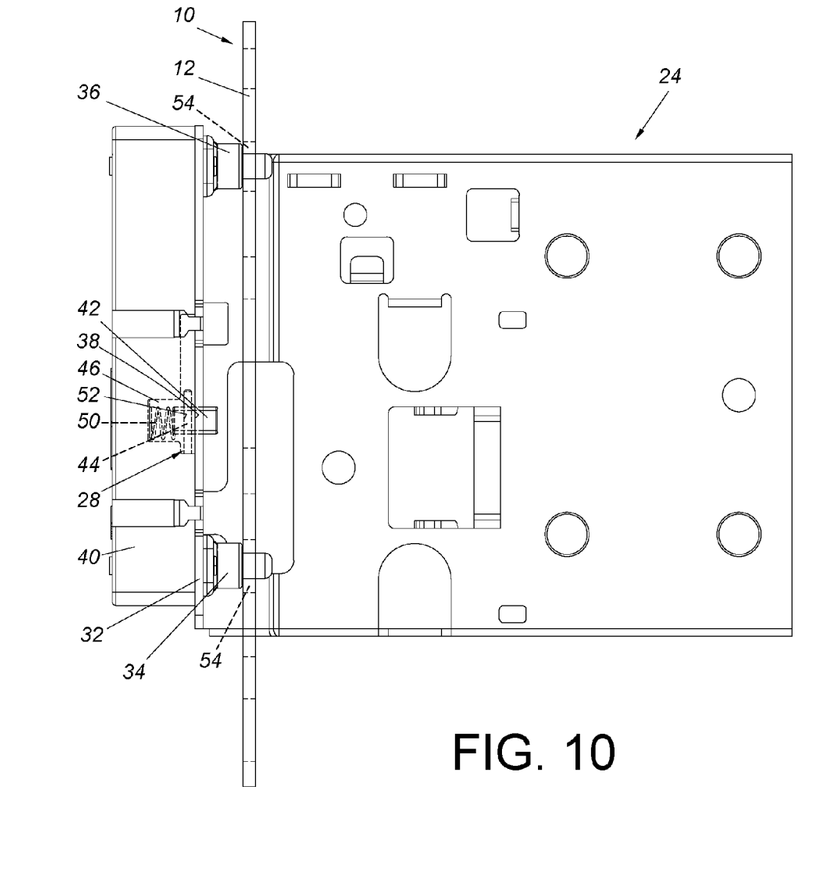
FIG. 10 is a diagram showing the first bracket being placed toward the post at the second mounting angle according to an embodiment of the present invention.
Figure 11:
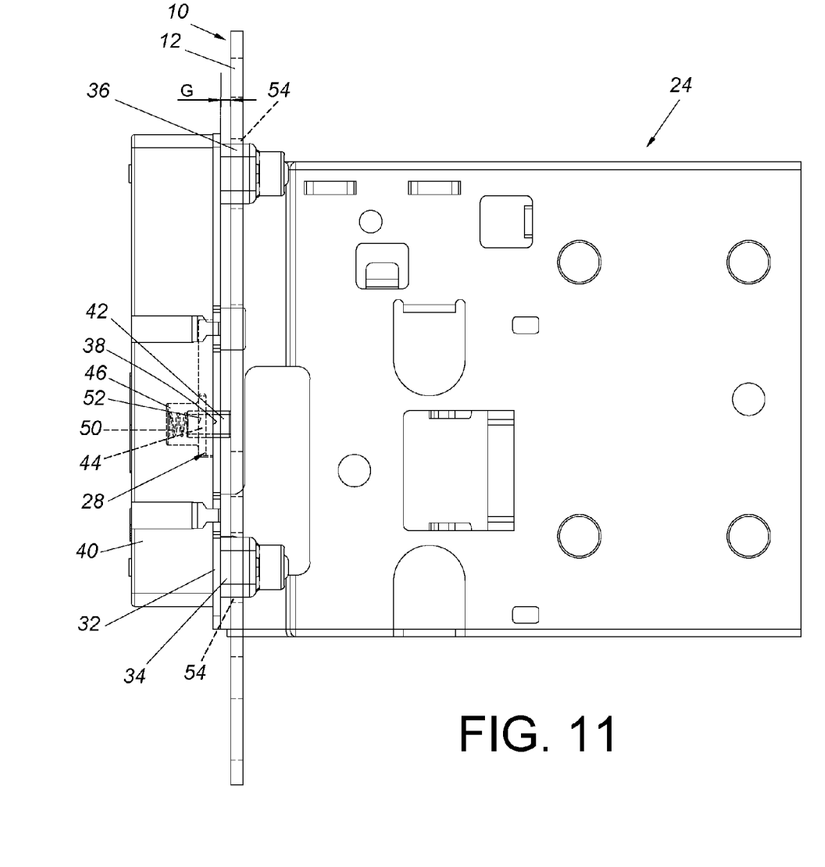
FIG. 11 is a diagram showing the first bracket being mounted to the post at the second mounting angle according to an embodiment of the present invention.

As shown in FIG. 10 and FIG. 11, the first bracket 24 is mounted to the post 12 at the second mounting angle, wherein an angle difference between the first mounting angle and the second mounting angle is 180 degrees. Therefore, the second mounting member 36 is located above the first mounting member 34. In such state, the positioning member 44 falls into the engagement feature 52 of the sliding block 42 due to gravity, such that the sliding block 42 is not movable within the first room 46 of the mounting base 40, and the sliding block 42 protrudes from the through hole 38 of the end plate 32 of the first bracket 24. As such, the foolproof device 28 interferes with the post 12, such that a gap G is formed between the first bracket 24 and the post 12, in order to prevent the first mounting member 34 and the second mounting member 36 of the first bracket 24 from being completely inserted into the mounting holes 54 of the post 12. In such wrong installation state, the locking member 56 of the present invention cannot be operatively arranged at the locking position relative to the post 12.

As mentioned above, when the bracket of the present invention is placed at the first mounting angle relative to the rack 10, the foolproof device 28 does not interfere with the rack 10, in order to allow the first mounting member 34 and the second mounting member 36 to be mounted to the rack 10. When the bracket is placed at the second mounting angle relative to the rack 10, the foolproof device 28 interferes with the rack 10, in order to prevent the first mounting member 34 and the second mounting member 36 from being mounted to the rack 10. That is to say, by mounting the foolproof device 28 to the end plate 32, the bracket can be selectively arranged to be able to be mounted to the rack 10 or unable to be mounted to the rack 10 according to different mounting angles. Therefore, the aforementioned foolproof device can effectively prevent the bracket of the rail from being mounted to the wrong side of the rack.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bracket of a slide rail assembly, configured to be mounted to a rack, the bracket comprising:
   a side plate;
   an end plate substantially perpendicularly connected to the side plate;
   a first mounting member mounted to the end plate; and
   a foolproof device arranged at a side of the end plate, the foolproof device comprising a sliding block;
   wherein the sliding block of the foolproof device is configured to be retracted into the end plate by the rack when the bracket is placed at a first mounting angle relative to the rack, in order to allow the first mounting member to be mounted to the rack;
   wherein the sliding block of the foolproof device is configured to be protruded from the end plate to mechanically interfere with the rack for forming a gap between the end plate and the rack when the bracket is placed at a second mounting angle, which is different from the first mounting angle, relative to the rack, in order to prevent the first mounting member from being mounted to the rack.

2. The bracket of claim 1, further comprising a mounting base mounted to the end plate, and connected to the first mounting member.

3. The bracket of claim 2, wherein the end plate has a through hole, the foolproof device comprises a sliding block and a positioning member, a first room is formed in a first part of the mounting base for accommodating the sliding block, a second room is formed in a second part of the mounting base for accommodating the positioning member;
   wherein when the bracket is placed at the first mounting angle relative to the rack, the sliding block is movable relative to the first room of the mounting base;
   wherein when the bracket is placed at the second mounting angle relative to the rack, the positioning member is moved to insert into an engagement feature of the sliding block in order to prevent the sliding block from moving relative to the first room of the mounting base, such that the sliding block interferes with the rack.

4. The bracket of claim 3, wherein the foolproof device further comprises an elastic member arranged in the first room of the mounting base for providing an elastic force to the sliding block, such that the sliding block is configured to partially pass through the through hole of the end plate of the bracket in response to the elastic force of the elastic member.

5. The bracket of claim 2, wherein an angle difference between the first mounting angle and the second mounting angle is 180 degrees.

6. The bracket of claim 1, further comprising a second mounting member mounted to the end plate of the bracket, and configured to be mounted to the rack.

7. A bracket of a slide rail assembly, configured to mount a rail to a post, the post having a plurality of mounting holes, the bracket comprising:
   a side plate configured to be mounted to the rail;
   an end plate having a through hole;
   a first mounting member mounted to the end plate of the bracket; and
   a foolproof device comprising a sliding block, a positioning member and an elastic member, wherein the sliding block corresponds to the through hole of the end plate, the sliding block has an engagement feature, the positioning member corresponds to the engagement feature of the sliding block, the elastic member is configured to provide an elastic force to the sliding block such that the sliding block is configured to partially pass through the through hole of the end plate in response to the elastic force of the elastic member;
   wherein the sliding block is configured to be retracted into the through hole of the end plate by the post for compressing the elastic member when the bracket is placed at a first mounting angle relative to the post, in order to allow the first mounting member to completely insert into one of the plurality of mounting holes for mounting the rail to the post;
   wherein the sliding block is configured to be protruded from the through hole of the end plate to mechanically interfere with the post for forming a gap between the end plate and the rack when the bracket is placed at a second mounting angle, which is different from the first mounting angle, relative to the post with the positioning member being engaged with the engagement feature of the sliding block, in order to prevent the first mounting element from being completely inserted into one of the plurality of mounting holes of the post.

8. The bracket of claim 7, further comprising a locking member operatively arranged at a locking position adjacent to the post.

9. The bracket of claim 7, wherein an angle difference between the first mounting angle and the second mounting angle is 180 degrees.

10. The bracket of claim 7, further comprising a second mounting member mounted to the end plate of the bracket, and configured to be mounted to the post.

* * * * *